(12) United States Patent
Takahashi et al.

(10) Patent No.: US 10,068,872 B2
(45) Date of Patent: Sep. 4, 2018

(54) MOUNTING APPARATUS AND METHOD OF CORRECTING OFFSET AMOUNT OF THE SAME

(71) Applicant: SHINKAWA LTD., Tokyo (JP)

(72) Inventors: Makoto Takahashi, Tokyo (JP); Akira Sato, Tokyo (JP)

(73) Assignee: SHINKAWA LTD., Tokyo (JP)

( * ) Notice: Subject to any disclaimer, the term of this patent is extended or adjusted under 35 U.S.C. 154(b) by 64 days.

(21) Appl. No.: 15/232,826

(22) Filed: Aug. 10, 2016

(65) Prior Publication Data

US 2016/0351528 A1 Dec. 1, 2016

Related U.S. Application Data

(63) Continuation of application No. PCT/JP2015/053534, filed on Feb. 9, 2015.

(30) Foreign Application Priority Data

Feb. 10, 2014 (JP) .................................. 2014-023042

(51) Int. Cl.
*G05B 15/00* (2006.01)
*G05B 19/00* (2006.01)
(Continued)

(52) U.S. Cl.
CPC ........ *H01L 24/75* (2013.01); *H01L 21/67144* (2013.01); *H01L 21/67259* (2013.01);
(Continued)

(58) Field of Classification Search
CPC ... H01L 24/75; H01L 24/81; H01L 21/67144; H01L 21/67259; H01L 21/681;
(Continued)

(56) References Cited

U.S. PATENT DOCUMENTS

| 5,189,707 A * | 2/1993 | Suzuki | H05K 13/0413 348/87 |
| 6,563,530 B1 * | 5/2003 | Oyama | H05K 13/08 348/87 |
| 7,102,148 B2 * | 9/2006 | Kodama | H05K 13/0413 250/559.3 |

FOREIGN PATENT DOCUMENTS

| JP | 2001-308148 | 11/2001 |
| JP | 3937162 | 6/2007 |

(Continued)

OTHER PUBLICATIONS

English translation for reference JP2007266425, 2007.*
(Continued)

*Primary Examiner* — Rachid Bendidi
(74) *Attorney, Agent, or Firm* — JCIPRNET

(57) ABSTRACT

A method, which includes: a first chip-position calculation step of taking an image of an upper surface of a reference chip and an image of a lower surface of a correction chip to calculate positions of the chips; a second chip-movement step of moving the reference chip to a position, based on a displacement amount between the chips that has been calculated based on the positions of the chips, at which a distance between the chips corresponds to a predetermined offset amount, and then placing the correction chip on the suction stage; a second chip-position calculation step of taking an image of an upper surface of the correction chip, and calculating a second position of the correction chip; and a correction amount calculation step of calculating a correction amount of the predetermined offset amount based on the position of the reference chip and the second position of the correction chip.

2 Claims, 5 Drawing Sheets

(51) Int. Cl.
*H01L 23/00* (2006.01)
*H01L 21/67* (2006.01)
*H01L 21/68* (2006.01)

(52) U.S. Cl.
CPC ............ *H01L 21/681* (2013.01); *H01L 24/81* (2013.01); *H01L 2224/759* (2013.01); *H01L 2224/7598* (2013.01); *H01L 2224/75753* (2013.01); *H01L 2224/75981* (2013.01); *H01L 2224/8113* (2013.01); *H01L 2224/81122* (2013.01); *H01L 2224/81908* (2013.01); *H01L 2224/83121* (2013.01); *H01L 2224/83908* (2013.01)

(58) Field of Classification Search
CPC ..... H01L 2224/75753; H01L 2224/759; H01L 2224/7598; H01L 2224/75981; H01L 2224/81122; H01L 2224/8113; H01L 2224/81908; H01L 2224/83121; H01L 2224/83908
See application file for complete search history.

(56) References Cited

FOREIGN PATENT DOCUMENTS

| | | | |
|---|---|---|---|
| JP | 2007-266425 | | 10/2007 |
| JP | 2007266425 | * | 11/2007 |

OTHER PUBLICATIONS

"International Preliminary Report on Patentability (Form/IPEA/409)" with English translation thereof, dated Mar. 30, 2016, p. 1-p. 13.

* cited by examiner

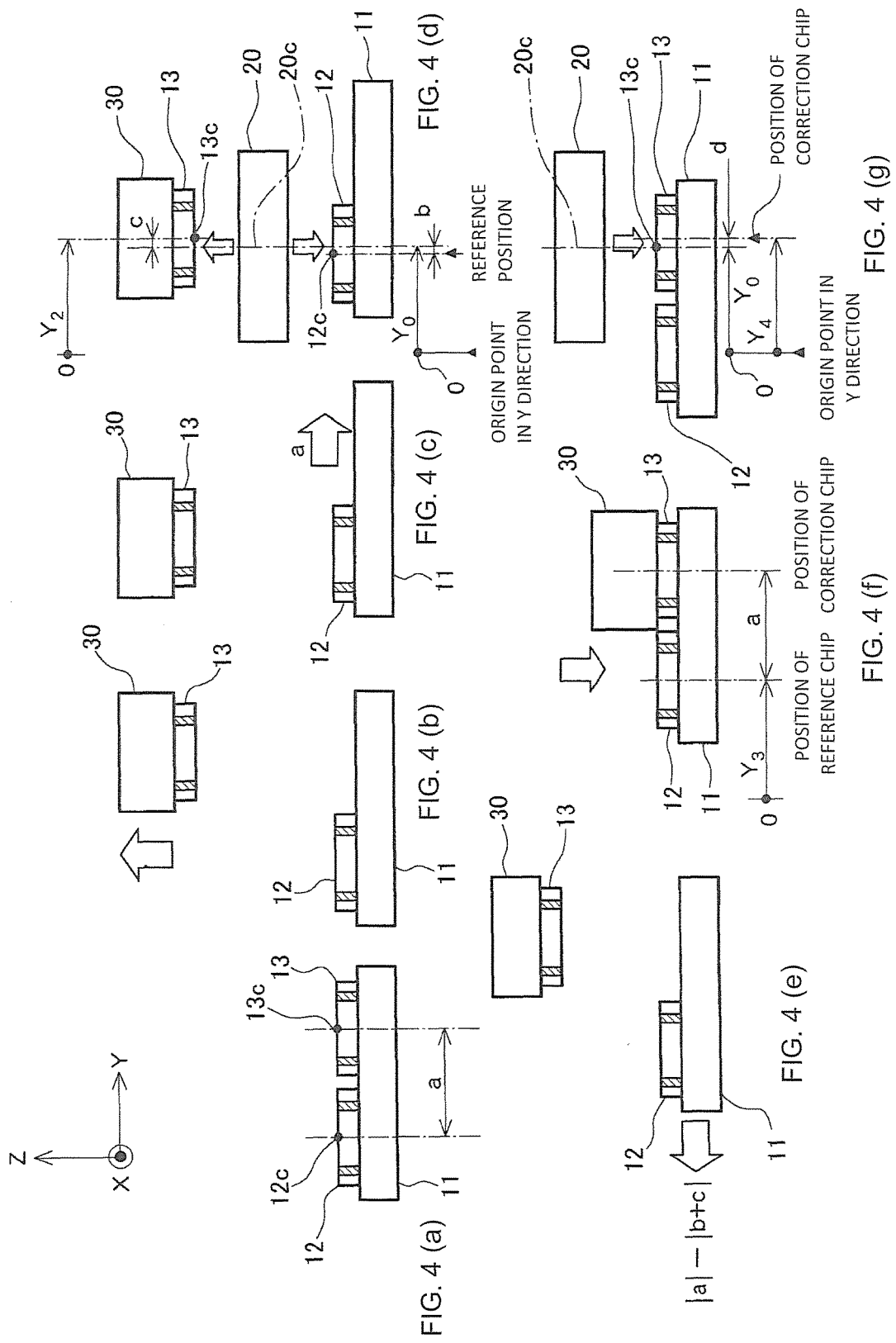

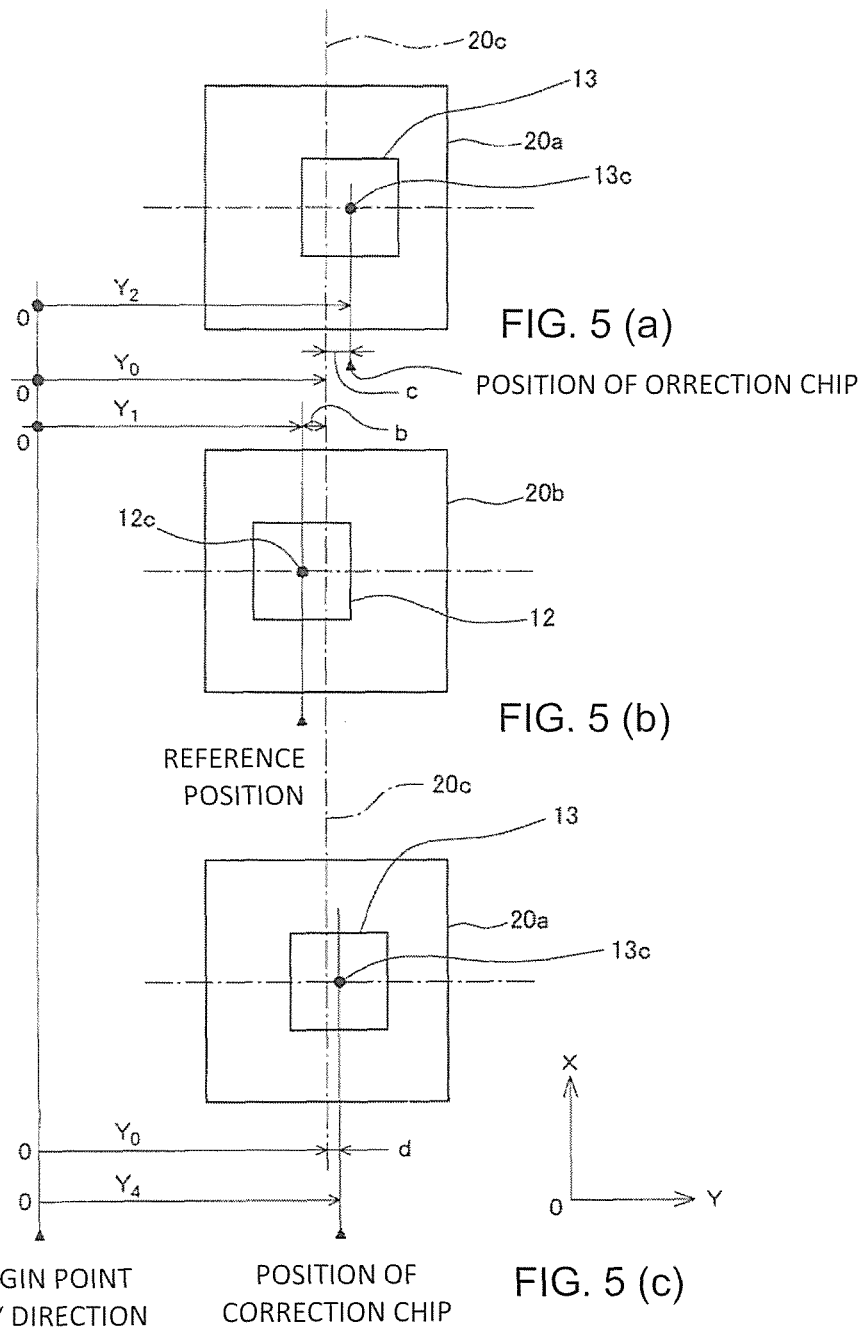

MOUNTING APPARATUS AND METHOD OF CORRECTING OFFSET AMOUNT OF THE SAME

CROSS REFERENCE TO RELATED APPLICATIONS

This application is a Continuation of PCT International Application No. PCT/JP2015/053534, filed on Feb. 9, 2015, which claims priority under 35 U.S.C § 119(a) to Patent Application No. 2014-023042, filed in Japan on Feb. 10, 2014, all of which are hereby expressly incorporated by reference into the present application.

TECHNICAL FIELD

The present invention relates to a structure of a mounting apparatus and a method of correcting an offset amount of the mounting apparatus.

BACKGROUND ART

Bonding apparatuses for bonding (mounting) a semiconductor chip on a substrate or on another semiconductor chip have been widely used. Among these, there are die bonding apparatuses for fixing a surface opposite of an electrode-side surface of a semiconductor chip to a substrate by an adhesive agent or the like, and flip-chip bonding apparatuses for directly joining an electrode of a semiconductor with an electrode of a substrate by turning over a semiconductor chip that has been picked up from a wafer and joining an electrode-side surface of the semiconductor chip with a substrate or the like. A typical flip-chip bonding apparatus is required to correctly align positions of an electrode of a semiconductor chip and an electrode of a substrate, as the electrode of the semiconductor chip is directly joined with the electrode of the substrate. Therefore, the flip-chip bonding apparatus employs a method of aligning positions of a substrate and a semiconductor chip by moving an upper/lower dual-view camera between a bonding tool and a substrate, taking an image of a semiconductor chip suctioned to the bonding tool and an image of the substrate at the same time, detecting relative positions of the semiconductor chip and the substrate based on the two images that have been taken, and then moving a bonding stage in an XY direction or rotating a bonding head (e.g., paragraphs 0003 to 0004 in PTL 1).

CITATION LIST

Patent Literature

PTL 1: Japanese Patent No. 3937162

SUMMARY OF INVENTION

Technical Problem

Incidentally, the flip-chip bonding apparatus (mounting apparatus) employs a method of joining an electrode of a semiconductor chip with an electrode of a substrate, for example, by forming a metal bump on a surface of an electrode of a semiconductor chip or an electrode of a substrate, pressing the semiconductor chip against the substrate and heating the semiconductor chip, using a bonding tool at high temperature, to cause the metal molten, and then solidifying the metal. Therefore, with the flip-chip bonding apparatus, there is a case in which bonding accuracy decreases due to positional displacement between the semiconductor chip and the substrate produced over time, as continuous bonding operation increases temperature of components of the bonding apparatus and a upper/lower dual-view camera to produce an error in measurement by the upper/lower dual-view camera and to increase an error in movement of the bonding apparatus. Here, as a joining surface is between the semiconductor chip and the substrate, it is conducted, after a predetermined length of bonding time or after predetermined times of bonding, to separate a semiconductor chip that has been bonded from the substrate to confirm whether or not an electrode of the semiconductor chip is joined at a predetermined position on an electrode of the substrate (destructive inspection), or to check a joining position based on photography using an X-ray apparatus or the like (X-ray non-destructive inspection).

However, as destructive inspection or X-ray non-destructive inspection of products cannot be carried out successively during operation of the flip-chip bonding apparatus, there is a case in which discovery of a defective product is delayed, resulting in an increased ratio of defective products.

Thus, the present invention allows a mounting apparatus to suppress positional displacement of a mounting position over time, and to improve mounting quality.

Solution to Problem

A mounting apparatus according to the present invention includes: a mounting stage; a reference chip and a correction chip that are placed on the mounting stage; an upper/lower dual-view camera configured to take an upper image and a lower image at the same time; and a control unit configured to move positions of the reference chip and the correction chip, and to process the images taken by the upper/lower dual-view camera.

The mounting apparatus according to the present invention is configured such that the control unit is configured to perform: a first chip-movement step of picking up the correction chip, moving the correction chip in an X direction and a Y direction by a predetermined offset amount, and positioning the correction chip right above the reference chip; a first image-obtaining step of moving the upper/lower dual-view camera between the correction chip and the reference chip, and having the upper/lower dual-view camera take an image of an upper surface of the reference chip and an image of a lower surface of the correction chip at the same time; a first chip-position calculation step of processing the images taken in the first image-obtaining step, and calculating a position of the reference chip in the XY direction and a position of the correction chip in the XY direction; a second chip-movement step of calculating a displacement amount between the reference chip and the correction chip in the XY direction based on the position of the reference chip in the XY direction and the position of the correction chip in the XY direction, moving the reference chip to a position in the XY direction, based on the calculated displacement amount, at which a distance between the reference chip and the correction chip in the XY direction corresponds to the predetermined offset amount, and then placing the correction chip on the mounting stage; a second image-obtaining step of moving the upper/lower dual-view camera above the correction chip, and having the upper/lower dual-view camera take an image of an upper surface of the correction chip placed on the mounting stage; a second chip-position calculation step of processing the image taken in the second image-obtaining step, and calculating a second position of the correction chip in the XY direction; and a correction amount calculation step of calculating a correction amount of the predetermined offset amount based on the position of the reference chip in the XY direction that has been calculated in the first chip-position calculation step, and on the second position of the correction chip in the XY direction that has been calculated in the second chip-position calculation step.

A method of correcting an offset amount of the mounting apparatus according to the present invention includes: a step of preparing a mounting apparatus including: a mounting stage; a reference chip and a correction chip that are placed on the mounting stage; an upper/lower dual-view camera configured to take an upper image and a lower image at the same time; and a control unit configured to move positions of the reference chip and the correction chip, and to process the images taken by the upper/lower dual-view camera; a first chip-movement step of picking up the correction chip, moving the correction chip in an X direction and a Y direction by a predetermined offset amount, and positioning the correction chip right above the reference chip; a first image-obtaining step of moving the upper/lower dual-view camera between the correction chip and the reference chip, and having the upper/lower dual-view camera take an image of an upper surface of the reference chip and an image of a lower surface of the correction chip at the same time; a first chip-position calculation step of processing the images taken in the first image-obtaining step, and calculating a position of the reference chip in the XY direction and a position of the correction chip in the XY direction; a second chip-movement step of calculating a displacement amount between the reference chip and the correction chip in the XY direction based on the position of the reference chip in the XY direction and the position of the correction chip in the XY direction, moving the reference chip to a position in the XY direction, based on the calculated displacement amount, at which a distance between the reference chip and the correction chip in the XY direction corresponds to the predetermined offset amount, and then placing the correction chip on the mounting stage; a second image-obtaining step of moving the upper/lower dual-view camera above the correction chip, and having the upper/lower dual-view camera take an image of an upper surface of the correction chip placed on the mounting stage; a second chip-position calculation step of processing the image taken in the second image-obtaining step, and calculating a second position of the correction chip in the XY direction; and a correction amount calculation step of calculating a correction amount of the predetermined offset amount based on the position of the reference chip in the XY direction that has been calculated in the first chip-position calculation step, and on the second position of the correction chip in the XY direction that has been calculated in the second chip-position calculation step.

Advantageous Effect of Invention

The present invention provides an effect of allowing a mounting apparatus to suppress positional displacement of a mounting position over time, and to improve mounting quality.

BRIEF DESCRIPTION OF DRAWINGS

FIG. 4(a) to FIG. 4(g) show illustrative diagrams of the operation of the mounting apparatus according to the embodiment of the present invention.

FIG. 5(a) to FIG. 5(c) show illustrative diagrams of views of an upper/lower dual-view camera according to the embodiment of the present invention.

DESCRIPTION OF EMBODIMENT

Figure 1:
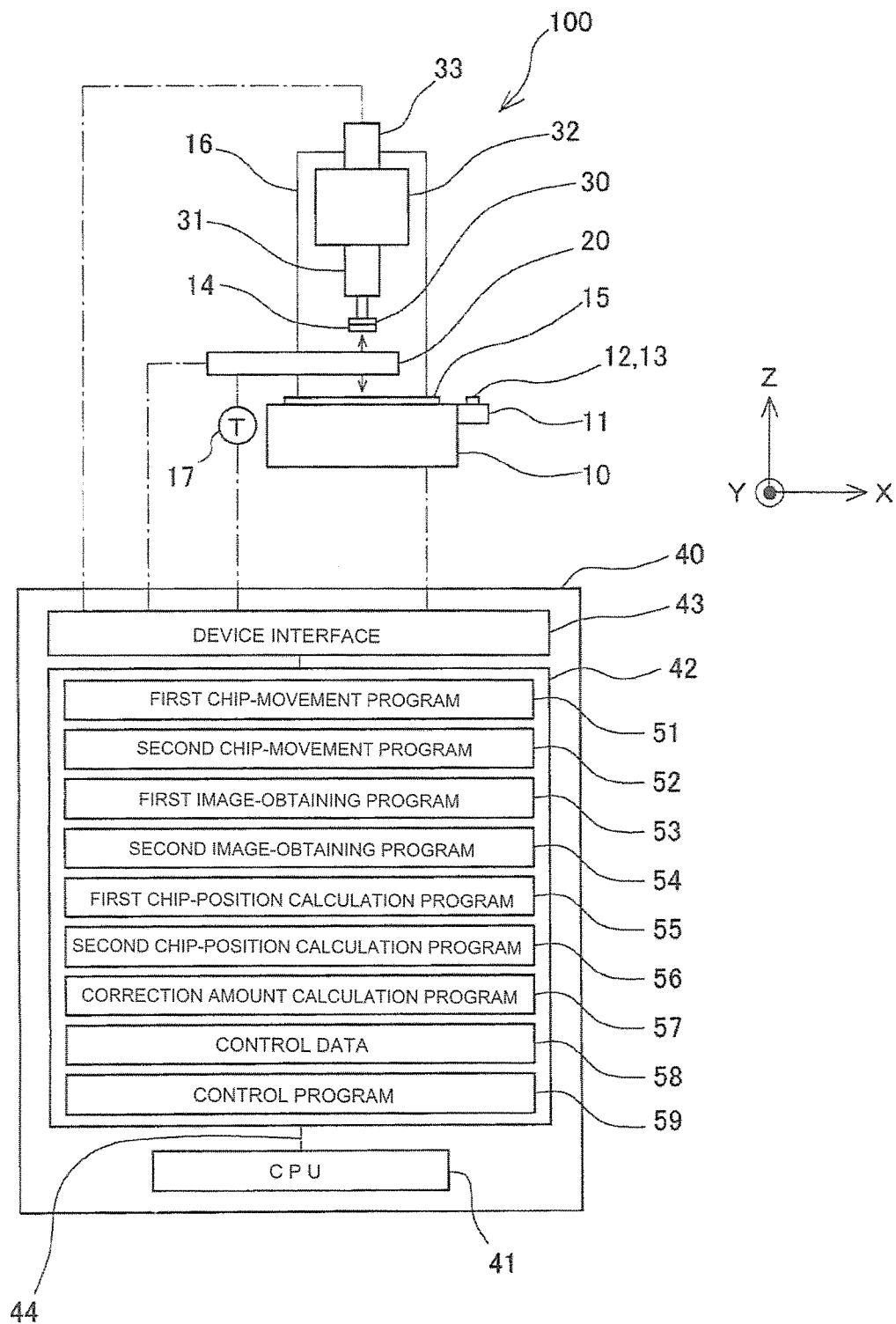
FIG. 1 shows a system diagram of a configuration of a mounting apparatus according to an embodiment of the present invention.

Hereinafter, an embodiment of the present invention will be described with reference to the drawings. In the following embodiment, an example of a mounting apparatus is described taking a case in which the invention is applied to a bonding apparatus. It should be understood that the invention can be applied to any apparatuses for mounting an electronic component, other than the bonding apparatus. As illustrated in FIG. 1, a bonding apparatus 100 as the mounting apparatus according to this embodiment includes a bonding stage 10 as a mounting stage that suctions a substrate 15 or a first semiconductor chip on which a semiconductor chip is to be bonded, a bonding tool 30 that suctions a second semiconductor chip 14 and bonds the second semiconductor chip 14 to the substrate 15 or the first semiconductor chip suctioned to the bonding stage 10, and an upper/lower dual-view camera 20 capable of taking an image of an upper surface of the substrate 15 or the first semiconductor chip and an image of a lower surface of the second semiconductor chip 14 at the same time.

The bonding stage 10 includes an XY driving mechanism that is not shown in the drawings, and is movable in an XY direction. Further, a bonding head 32 is movable up and down by a Z-direction guide attached to a frame 16, and is driven by a Z-direction motor 33 up and down as well as in a manner rotational about a Z axis (Z direction and θ direction). The bonding tool 30 as a mounting tool is fixed to a shank 31 attached to the bonding head 32, and is movable up and down along with the bonding head 32 (in a direction moving closer to and away from the substrate 15). The upper/lower dual-view camera 20 contains two pickup devices and two optical systems, and is able to take coaxial images of the upper surface of the substrate 15 and the lower surface of the second semiconductor chip 14 at the same time as illustrated in FIG. 1. To the upper/lower dual-view camera 20, a temperature sensor 17 is also attached. A suction stage 11 that is able to suction a reference chip 12 and a correction chip 13 is attached to a side of the bonding stage 10. The suction stage 11 is movable in the XY direction along with the bonding stage 10. The reference chip 12 and the correction chip 13 are not actual semiconductor chips, but glass chips, and include position marks that can be seen on the upper surface and the lower surface as shown by hatching in FIG. 4(a) to FIG. 4(g). As illustrated in FIG. 4(a), the reference chip 12 and the correction chip 13 are placed on the suction stage 11 and spaced from each other in a Y direction by a predetermined offset amount a.

The bonding stage 10 and the Z-direction motor 33 that drives the bonding head 32 are driven by an instruction from a control unit 40. Further, the upper/lower dual-view camera 20 and the temperature sensor 17 are also connected to the control unit 40. Images taken by the upper/lower dual-view camera 20 and temperature data detected by the temperature sensor 17 are input to the control unit 40 subject to image processing and arithmetic processing. The control unit 40 is a computer including a CPU 41 that performs image processing and calculation, a storage unit 42 that stores a control program 59, a control data 58, and the like, and a device interface 43 to which the bonding stage 10, the Z-direction motor 33, and the upper/lower dual-view camera 20 are connected. The CPU 41, the storage unit 42, and the device interface 43 are connected by a data bus 44. The storage unit 42 of the control unit 40 stores a first chip-movement program 51 and a second chip-movement program 52, a first image-obtaining program 53 and a second image-obtaining program 54, a first chip-position calculation program 55 and a second chip-position calculation program 56, and a correction amount calculation program 57, all of which will be described later. Here, the description is given assuming that in FIG. 1, a right-left direction of the sheet corresponds to an X direction, a top-bottom direction of the sheet corresponds to the Z direction, and a vertical direction with respect to of the sheet corresponds to the Y direction of the bonding apparatus 100.

An operation of the bonding apparatus 100 thus configured will be described with reference to FIG. 2 through FIG. 5($a$) to FIG. 5($c$). As shown by Step S101 in FIG. 2, the control unit 40 obtains temperature of the upper/lower dual-view camera 20 from the temperature sensor 17 shown in FIG. 1, and as shown by Step S102 in FIG. 2, the control unit 40 determines whether or not a temperature change (temperature difference) after a previously performed correcting operation exceeds a predetermined set value. Then, if the temperature change of the upper/lower dual-view camera 20 is greater than the predetermined set value, the control unit 40 moves the operation to Step S103 in FIG. 2, and executes a correction sequence shown in FIG. 3.

When the temperature change of the upper/lower dual-view camera 20 exceeds the predetermined set value, it is conceivable that there is an error in measurement by the upper/lower dual-view camera 20 due to displacement or inclination of an optical axis 20$c$ of the upper/lower dual-view camera 20 shown in FIG. 4($a$) to FIG. 4($g$) and FIG. 5($a$) to FIG. 5($c$). It is also conceivable that at the same time, temperature of the frame 16 and the bonding stage 10 of the bonding apparatus 100 is increased, and positions of the frame 16 and the bonding stage 10 are become displaced. Even more, there is a case in which a bonding position (mounting position) of the second semiconductor chip 14 shown in FIG. 1 is displaced from a predetermined position due to these two types of positional displacement, and an electrode of the second semiconductor chip 14 may not be correctly joined to an electrode of the substrate 15. As the upper/lower dual-view camera 20 is basically attached to the frame 16, it is difficult to separately measure and grasp errors (positional displacement) in the two types of positional displacement (error) produced when the second semiconductor chip 14 is bonded. However, it is sufficient to correct displacement of the bonding position (mounting position) as long as an error or positional displacement that is finally produced is detected and corrected. According to this embodiment, displacement of the bonding position (mounting position) (an error of the bonding position (mounting position)) is corrected by detecting positional displacement that is finally produced in bonding as described above and by correcting the final positional displacement.

For convenience sake, the following description is given assuming that a position and inclination of a central axis of the upper/lower dual-view camera 20 or the vertical optical axis 20$c$ does not change, but the frame and the bonding stage 10 are moved due to heat. Ultimately, a correction amount s that the bonding apparatus 100 obtains according to this embodiment described below is a correction amount for correcting a total positional displacement amount of positional displacement due to an error in measurement by the upper/lower dual-view camera 20 and positional displacement produced due to a change in temperature of mechanical components.

Figure 3:
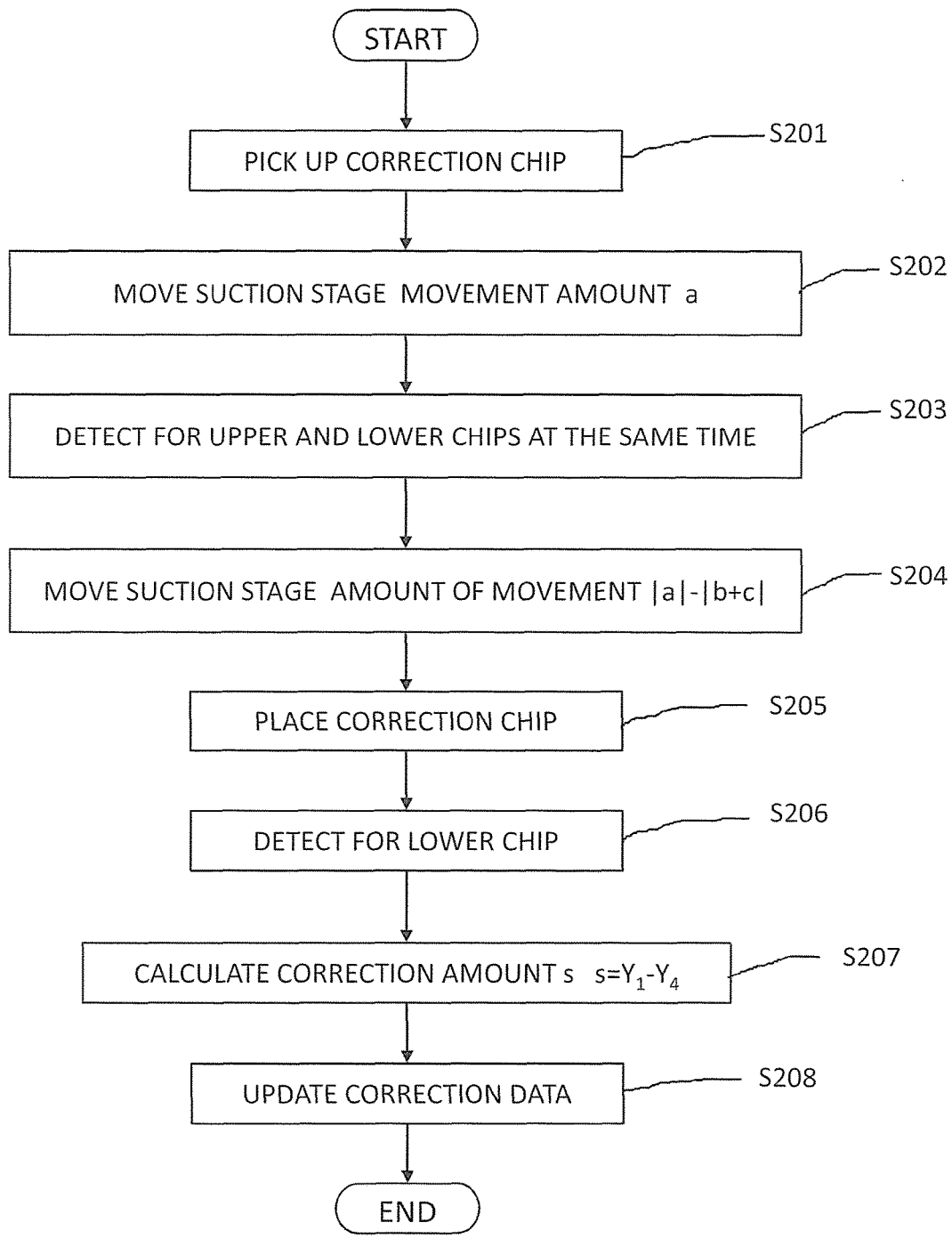
FIG. 3 shows a flowchart of a correction sequence in detail in the flowchart shown in FIG. 2.

As shown by Step S201 in FIG. 3, the control unit 40 executes the first chip-movement program 51 shown in FIG. 1 (first chip-movement step). The control unit 40 moves the bonding tool 30 down toward the correction chip 13, out of the reference chip 12 and the correction chip 13 placed on the suction stage 11 with the predetermined offset amount a (a predetermined distance ΔY) between the reference chip 12 and the correction chip 13 as shown in FIG. 4($a$), suctions the correction chip 13 using the bonding tool 30, and picks up the correction chip 13 as shown in FIG. 4($b$).

Next, as shown by Step S202 in FIG. 3, the control unit 40 moves the suction stage 11 by the predetermined offset amount a in the Y direction. Then, as shown in FIG. 4($c$), the correction chip 13 comes right above the reference chip 12. However, in actual operation, as shown in FIG. 4($c$), a center of the reference chip 12 and a central position of the correction chip 13 are slightly displaced in the Y direction due to heat or the like of the mechanical components (end of the first chip-movement program 51 (first chip-movement step)).

Subsequently, as shown by Step S203 in FIG. 3, the control unit 40 executes the first image-obtaining program 53 shown in FIG. 1 (first image-obtaining step). As shown in FIG. 4($d$), the control unit 40 moves the upper/lower dual-view camera 20 between the correction chip 13 suctioned to the bonding tool 30 and the reference chip 12 placed on the suction stage 11. As described previously, the description here is given, for convenience sake, assuming that the optical axis and a detection position of the upper/lower dual-view camera 20 do not change. Therefore, the optical axis 20$c$ of the upper/lower dual-view camera 20 comes at an absolute position $Y_0$ from an origin point of the bonding apparatus 100. Then, the control unit 40 takes an image of an upper surface of the reference chip 12 using a lower-side camera of the upper/lower dual-view camera 20, and an image of the correction chip 13 using an upper-side camera of the upper/lower dual-view camera 20. As shown in FIG. 4($d$), a Y-direction position of a center 12$c$ of the reference chip 12 is displaced by a distance b to a negative side in the Y direction from the optical axis 20$c$ of the upper/lower dual-view camera 20, and the central position of the correction chip 13 is displaced by a distance c to a positive side in the Y direction from a position of the optical axis 20$c$ the upper/lower dual-view camera 20. Accordingly, as shown in FIG. 5($a$), in a view 20$a$ of the upper-side camera, a position of the correction chip 13 is displaced rightward in the figure from a central axis 20$c$ of the upper/lower dual-view camera 20 (the optical axis of the upper/lower dual-view camera 20), and a center 13$c$ of the correction chip 13 is also seen at a position displaced by the distance c rightward from the central axis 20$c$ of the view 20$a$. Further, as shown in FIG. 5($b$), in a view 20$b$ of the lower-side camera, a position of the reference chip 12 is displaced leftward in the figure from the central axis 20$c$ of the upper/lower dual-view camera 20, and the center 12$c$ of the reference chip 12 is also seen at a position displaced by the distance b leftward from the central axis 20$c$ of the view 20$b$ (the optical axis of the upper/lower dual-view camera 20) (end of the first image-obtaining program 53 (first image-obtaining step)).

Next, the control unit 40 executes the first chip-position calculation program 55 shown in FIG. 1 (first chip-position calculation step). The control unit 40 processes the image of the reference chip 12 and the image of the correction chip 13, and obtains the distances b and c from the central axis (optical axis) 20c of the upper/lower dual-view camera 20. Then, the control unit 40 calculates a Y-direction absolute position $Y_1$ of the reference chip 12 from the origin point of the bonding apparatus 100, and a Y-direction absolute position $Y_2$ of the correction chip 13 from the origin point of the bonding apparatus 100 (a first position of the correction chip). As shown in FIG. 4(d) and FIG. 5(b), the Y-direction absolute position $Y_1$ is expressed as $Y_1=Y_0-b$, and the Y-direction absolute position $Y_2$ is expressed as $Y_2=Y_0+c$ as shown in FIG. 4(d) and FIG. 5(b) (end of the first chip-position calculation program 55 (first chip-position calculation step)).

Subsequently, the control unit 40 executes the second chip-movement program 52 shown in FIG. 1 (second chip-movement step). First, the control unit 40 calculates an amount of movement of the center 13c of the correction chip 13 required to make a displacement amount ΔYe between the center 12c of the reference chip 12 and the center 13c of the correction chip 13 be the predetermined offset amount a. As shown in FIG. 4(d), FIG. 5(a), and FIG. 5(b), the center 12c of the reference chip 12 is displaced from the center 13c of the correction chip 13 by the displacement amount ΔYe (=b+c). Therefore, in order to make a distance between the center 12c and the center 13c be the predetermined offset amount a, it is sufficient either to move the correction chip 13 to the positive side in the Y direction by (a−ΔYe)=a' taking a position of the center 12c of the reference chip 12 shown in FIG. 4(e) (Y-direction absolute position $Y_1$) as a reference, or to move the position of the center 12c of the reference chip 12 (reference position) to the negative side in the Y direction by (a−ΔYe)=a' as shown in FIG. 4(e). As shown by Step S204 in FIG. 3 and FIG. 4(e), the control unit 40 moves the suction stage 11 to the negative side in the Y direction by (a−ΔYe)=a'. Then, as shown in FIG. 4(d), the absolute position of the center 12c of the reference chip 12 in the Y direction is expressed as $Y_3=Y_1-a+\Delta Ye$. As a Y-direction absolute position of the center 13c of the correction chip 13 remains $Y_2=Y_1+\Delta Ye$ without changing, the distance ΔY between the reference chip 12 and the correction chip 13 in the Y direction is expressed as $\Delta Y=Y_2-Y_3=Y_1+\Delta Ye-(Y_1-a+\Delta Ye)=a$. Thus, placing the correction chip 13 suctioned to the bonding tool 30 on the suction stage 11 should make the distance ΔY between the center 12c of the reference chip 12 and the center 13c of the correction chip 13 be the predetermined offset amount a. Then, as shown by Step S205 in FIG. 3 and FIG. 4(d), the control unit 40 moves the bonding tool 30 downward and places the correction chip 13 on a surface of the suction stage 11 (end of the second chip-movement program 52 (second chip-movement step)).

The above operation is, in other words, to correct the displacement amount ΔYe=(b+c) between the center 12c of the reference chip 12 and the center 13c of the correction chip 13, and the offset amount a being zero means that the correction chip 13 is placed on the reference chip 12 with the center 12c of the reference chip 12 and the center 13c of the correction chip 13 coinciding with each other.

Next, the control unit 40 executes the second image-obtaining program 54 shown in FIG. 1 (second image-obtaining step). As shown in FIG. 4(e), after moving the bonding tool 30 upward, the control unit 40 again moves the upper/lower dual-view camera 20 so that the central axis 20c (optical axis) of the upper/lower dual-view camera 20 comes at the absolute position $Y_0$ from the origin point of the bonding apparatus 100. Subsequently, as shown by Step S206 in FIG. 3, the control unit 40 takes an image of an upper surface of the correction chip 13 placed on the suction stage 11 using the lower-side camera of the upper/lower dual-view camera 20, executes the second chip-position calculation program 56 shown in FIG. 1 (second chip-position calculation step), and processes the taken image to calculate a Y-direction absolute position $Y_4$ of the center 13c of the correction chip 13 that is placed (a second position of the correction chip 13).

As described previously, the above operation is to virtually place the correction chip 13 over the reference chip 12 based on the offset amount a. Therefore, when an image of the correction chip 13 placed on the suction stage 11 is taken using the lower-side camera, the Y-direction absolute position of the center 13c of the correction chip 13 should be $Y_1$, similarly to the center 12c of the reference chip 12 when the image of the reference chip 12 is taken using the lower-side camera. However, in practice, the Y-direction absolute position $Y_4$ of the center 13c of the correction chip 13 that has been measured (the second position of the correction chip 13) is a position distant from $Y_0$ by a distance d, and the Y-direction absolute position $Y_4$ ((the second position of the correction chip 13) is expressed as $Y_4=Y_0+d$. A difference between $Y_1$ (a first Y-direction absolute position of the reference chip 12) and $Y_4$ (a second Y-direction absolute position of the correction chip 13) corresponds to a displacement amount when the correction chip 13 is placed over the reference chip 12, and a total displacement amount of the displacement amount of the optical axis 20c of the upper/lower dual-view camera 20 and the displacement produced due to thermal expansion of the mechanical components. Therefore, as shown by Step S207 in FIG. 3, the control unit 40 corrects the offset amount a taking a difference $(Y_1-Y_4)$ between $Y_1$ (the first Y-direction absolute position of the reference chip 12) and $Y_4$ (the second Y-direction absolute position of the correction chip 13) as the correction amount s, and updates the offset amount a to $a=a+s=a+(Y_1-Y_4)$ as shown by Step S208 in FIG. 3 (execution of the correction amount calculation program 57 shown in FIG. 1 (correction amount calculation step)).

Figure 2:
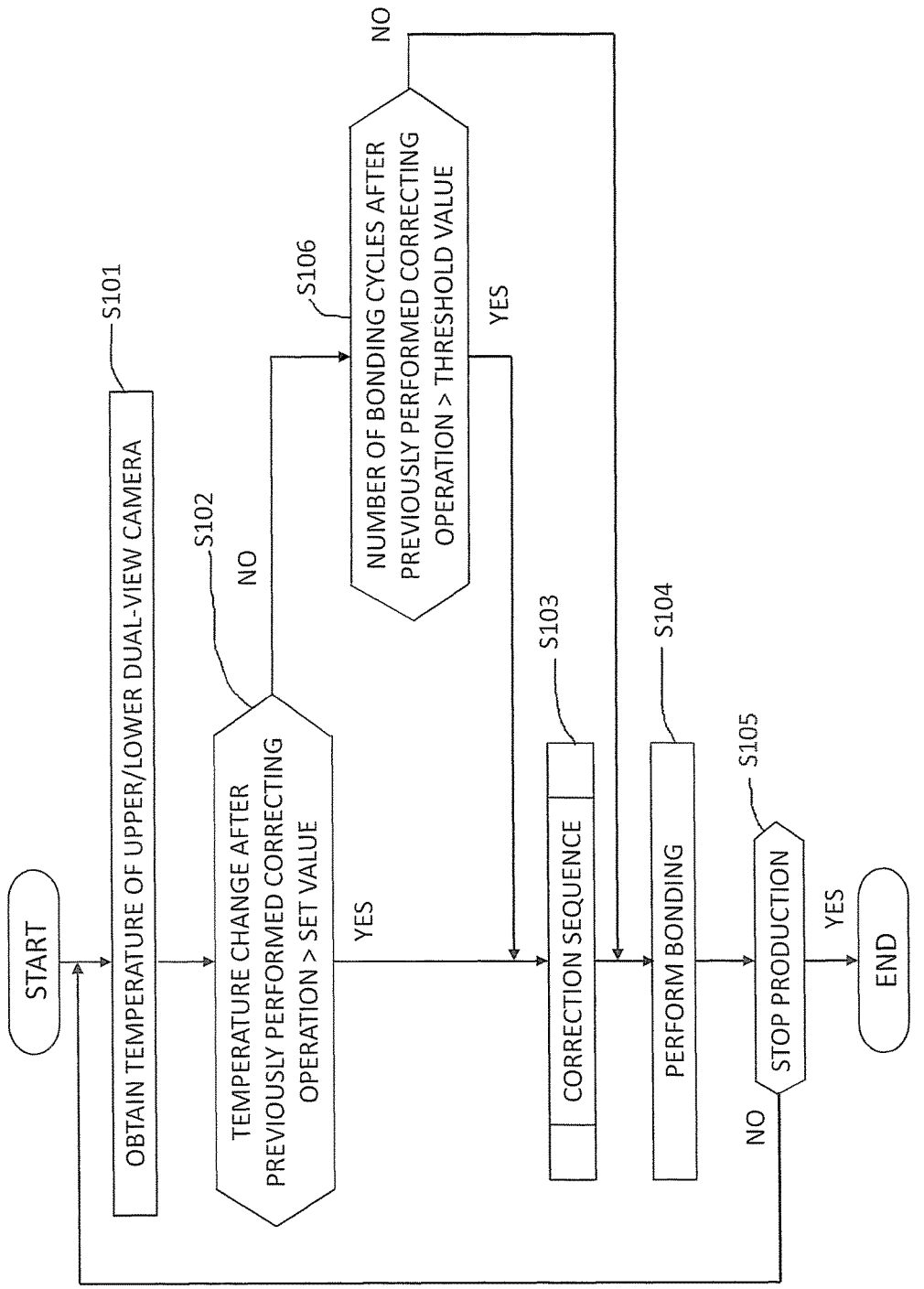
FIG. 2 shows a flowchart of an operation of the mounting apparatus according to the embodiment of the present invention.

Thus, the control unit 40 completes the correction sequence shown by Step S103 in FIG. 2, and continues bonding as shown by Step S104 in FIG. 3. Then, as shown by Step S105 in FIG. 2, the control unit 40 determines whether or not bonding has been completed entirely. If the bonding has been completed entirely and production ends, the control unit 40 stops the bonding apparatus 100. If the production has not ended, the control unit 40 returns the operation to Step S101 in FIG. 2, and monitors the temperature of the upper/lower dual-view camera 20.

The control unit 40 also counts a number of bonding cycles, and when the number of bonding cycles reaches a predetermined threshold value as shown by Step S106 in FIG. 2, performs the correction sequence shown by Step S103 in FIG. 2 even if the change in the temperature of the upper/lower dual-view camera 20 does not exceed the predetermined set value.

The correction sequence described above provides an advantageous effect of effectively allowing the bonding apparatus 100 to suppress positional displacement of the bonding position (mounting position) over time and to improve its bonding quality (mounting quality), by measuring the total displacement amount of the displacement amount of the optical axis 20c of the upper/lower dual-view camera 20 when the offset amount is a and the displacement produced due to thermal expansion of the mechanical components, and correcting the offset amount a taking the displacement amount as the correction amount s. Further, in this embodiment, it is described that the offset amount a is corrected taking the difference ($Y_1-Y_4$) between $Y_1$ (the first Y-direction absolute position of the reference chip 12) and $Y_4$ (the second Y-direction absolute position of the correction chip 13) as the correction amount s. However, the offset amount a can be corrected taking ½ of ($Y_1-Y_4$) as the correction amount s, or a ratio between ($Y_1-Y_4$) and the correction amount s can be altered depending on time, a number of bonding times, a number of correction times, or the like.

In the above description, the correction amount s is calculated by moving the suction stage 11 in the XY direction. However, it is sufficient that the reference chip 12 and the correction chip 13 move relative to each other in the XY direction by the offset amount a. Therefore, in a case of a bonding apparatus having the bonding head 32 movable in the XY direction, it is possible to calculate the correction amount s by moving the bonding head 32 in the XY direction, in place of the suction stage 11. Further, this embodiment is applicable to bonding apparatuses in general, such as flip-chip bonding apparatuses and die bonding apparatuses. Moreover, while the correction amount s in the Y direction is obtained in the above embodiment, this also applies to the X direction. Furthermore, the correction amount s in the XY direction can be obtained at once by moving the suction stage in an oblique direction.

The present invention is not limited to the embodiment described above, and includes any alterations and modifications without departing from the technical scope and the spirit of the present invention as defined by the appended claims.

The invention claimed is:

1. A mounting apparatus comprising:
   a mounting stage;
   a reference chip and a correction chip that are placed on the mounting stage;
   an upper/lower dual-view camera configured to take an upper image and a lower image at the same time; and
   a control unit configured to move positions of the reference chip and the correction chip, and to process the images taken by the upper/lower dual-view camera, wherein the control unit is a computer including a CPU, and is configured to perform:
      a first chip-movement step of picking up the correction chip, moving the correction chip in an X direction and a Y direction by a predetermined offset amount, and positioning the correction chip right above the reference chip;
      a first image-obtaining step of moving the upper/lower dual-view camera between the correction chip and the reference chip, and having the upper/lower dual-view camera take an image of an upper surface of the reference chip and an image of a lower surface of the correction chip at the same time;
      a first chip-position calculation step of processing the images taken in the first image-obtaining step, and calculating an initial position of the reference chip in the XY direction and a position of the correction chip in the XY direction;
      a second chip-movement step of calculating a displacement amount between the reference chip and the correction chip in the XY direction based on the initial position of the reference chip in the XY direction and the position of the correction chip in the XY direction, moving the reference chip to a new position in the XY direction, based on the calculated displacement amount, at which a distance between the reference chip and the correction chip in the XY direction corresponds to the predetermined offset amount, and then placing the correction chip on the mounting stage;
      a second image-obtaining step of moving the upper/lower dual-view camera above the correction chip, and having the upper/lower dual-view camera take an image of an upper surface of the correction chip placed on the mounting stage;
      a second chip-position calculation step of processing the image taken in the second image-obtaining step, and calculating a second position of the correction chip in the XY direction; and
      a correction amount calculation step of calculating a correction amount of the predetermined offset amount based on the initial position of the reference chip in the XY direction that has been calculated in the first chip-position calculation step, and on the second position of the correction chip in the XY direction that has been calculated in the second chip-position calculation step.

2. A method of correcting offset amount of a mounting apparatus including: a mounting stage; a reference chip and a correction chip that are placed on the mounting stage; an upper/lower dual-view camera configured to take an upper image and a lower image at the same time; and a control unit configured to move positions of the reference chip and the correction chip, and to process the images taken by the upper/lower dual-view camera, wherein the control unit is a computer including a CPU, the method comprising:
   a first chip-movement step of picking up the correction chip, moving the correction chip in an X direction and a Y direction by a predetermined offset amount, and positioning the correction chip right above the reference chip;
   a first image-obtaining step of moving the upper/lower dual-view camera between the correction chip and the reference chip, and having the upper/lower dual-view camera take an image of an upper surface of the reference chip and an image of a lower surface of the correction chip at the same time;
   a first chip-position calculation step of processing the images taken in the first image-obtaining step, and calculating an initial position of the reference chip in the XY direction and a position of the correction chip in the XY direction;
   a second chip-movement step of calculating a displacement amount between the reference chip and the correction chip in the XY direction based on the initial position of the reference chip in the XY direction and the position of the correction chip in the XY direction, moving the reference chip to a new position in the XY direction, based on the calculated displacement amount, at which a distance between the reference chip and the correction chip in the XY direction corresponds to the predetermined offset amount, and then placing the correction chip on the mounting stage;
   a second image-obtaining step of moving the upper/lower dual-view camera above the correction chip, and having the upper/lower dual-view camera take an image of an upper surface of the correction chip placed on the mounting stage;

a second chip-position calculation step of processing the image taken in the second image-obtaining step, and calculating a second position of the correction chip in the XY direction; and a correction amount calculation step of calculating a correction amount of the predetermined offset amount based on the initial position of the reference chip in the XY direction that has been calculated in the first chip-position calculation step, and on the second position of the correction chip in the XY direction that has been calculated in the second chip-position calculation step.

* * * * *